United States Patent
Brick et al.

(10) Patent No.: US 9,018,641 B2
(45) Date of Patent: Apr. 28, 2015

(54) METHOD FOR PRODUCING A RADIATION-EMITTING COMPONENT AND RADIATION-EMITTING COMPONENT

(75) Inventors: Peter Brick, Regensburg (DE); Uwe Strauss, Bad Abbach (DE)

(73) Assignee: CSRAM Opto Semiconductors GmbH, Regensburg (DE)

( * ) Notice: Subject to any disclaimer, the term of this patent is extended or adjusted under 35 U.S.C. 154(b) by 1103 days.

(21) Appl. No.: 12/745,686

(22) PCT Filed: Oct. 24, 2008

(86) PCT No.: PCT/DE2008/001734
§ 371 (c)(1),
(2), (4) Date: Jun. 27, 2011

(87) PCT Pub. No.: WO2009/067969
PCT Pub. Date: Jun. 4, 2009

(65) Prior Publication Data
US 2011/0266567 A1 Nov. 3, 2011

(30) Foreign Application Priority Data

Nov. 30, 2007 (DE) .......................... 10 2007 057 773
Dec. 20, 2007 (DE) .......................... 10 2007 061 458

(51) Int. Cl.
*H01L 29/49* (2006.01)
*H01S 5/32* (2006.01)
*H01S 5/00* (2006.01)
*H01S 5/10* (2006.01)
(Continued)

(52) U.S. Cl.
CPC ................. *H01S 5/32* (2013.01); *H01S 5/0035* (2013.01); *H01S 5/10* (2013.01); *H01S 5/1017* (2013.01); *H01S 5/204* (2013.01); *H01S 5/3095* (2013.01); *H01S 5/3215* (2013.01); *H01S 5/4043* (2013.01); *H01S 2301/18* (2013.01); *H01S 2301/185* (2013.01); *H01S 2301/206* (2013.01)

(58) Field of Classification Search
USPC ................. 372/45.01, 50, 53; 257/79, 94, 86, 257/E33.065, E33.072
See application file for complete search history.

(56) References Cited

U.S. PATENT DOCUMENTS 5,212,706 A * 5/1993 Jain .............................. 372/50.1
5,457,709 A   10/1995 Capasso et al.
(Continued)

FOREIGN PATENT DOCUMENTS

EP    0 676 839      10/1995
JP    63-208290      8/1988
(Continued)

OTHER PUBLICATIONS

"Section 7.2 Semiconductor Diode Lasers ED—Gupta M C", Handbook of Photonics, CRC Press, pp. 292-298, Jan. 1, 1997, XP009114823.

*Primary Examiner* — Michael Shingleton
(74) *Attorney, Agent, or Firm* — Cozen O'Connor

(57) ABSTRACT

A method for manufacturing a radiation-emitting component (1) in which a field distribution of a near field (101, 201) in a direction perpendicular to a main emission axis of the component is specified. From the field distribution of the near field, an index of refraction profile (111, 211, 511) along this direction is determined. A structure is determined for the component such that the component will have the previously determined index of refraction profile. The component is constructed according to the previously determined structure. A radiation-emitting component is also disclosed.

6 Claims, 8 Drawing Sheets

(51) Int. Cl.
  *H01S 5/20* (2006.01)
  *H01S 5/30* (2006.01)
  *H01S 5/40* (2006.01)

(56) References Cited

U.S. PATENT DOCUMENTS

| | | |
|---|---|---|
| 5,815,521 A | 9/1998 | Hobson et al. |
| 6,274,891 B1 | 8/2001 | Tanaka et al. |
| 2001/0038656 A1 | 11/2001 | Takeuchi et al. |
| 2003/0031220 A1 | 2/2003 | Takeuchi et al. |
| 2004/0013147 A1 | 1/2004 | Buda et al. |
| 2004/0047379 A1 | 3/2004 | Kitamura |
| 2004/0091010 A1 | 5/2004 | Choquette et al. |
| 2005/0089073 A1 | 4/2005 | Behringer et al. |
| 2006/0193359 A1 | 8/2006 | Kuramoto |
| 2006/0274793 A1 | 12/2006 | Qiu |
| 2009/0092163 A1 * | 4/2009 | Hirata et al. ........... 372/45.01 |
| 2010/0189153 A1 | 7/2010 | Brick |

FOREIGN PATENT DOCUMENTS

| | | |
|---|---|---|
| JP | 64-80088 | 3/1989 |
| JP | 08-279647 | 10/1996 |
| JP | 11-330540 | 11/1999 |
| JP | 2000-151018 | 5/2000 |
| JP | 2005-116728 | 4/2005 |
| JP | 2006-270028 | 10/2006 |
| JP | 2009-088425 | 4/2009 |
| WO | WO 2009/039808 | 4/2009 |

* cited by examiner

FIG 2E

| z [μm] | n | X [%] | z [μm] | n | X [%] |
|---|---|---|---|---|---|
| -2.3 | 3.05 | 75 | | | |
| -2.25 | 3.16 | 57 | 0.05 | 3.37 | 22 |
| -2.2 | 3.23 | 45 | 0.1 | 3.37 | 22 |
| -2.15 | 3.28 | 36 | 0.15 | 3.37 | 22 |
| -2.1 | 3.32 | 30 | 0.2 | 3.37 | 22 |
| -2.05 | 3.35 | 26 | 0.25 | 3.37 | 22 |
| -2 | 3.36 | 23 | 0.3 | 3.37 | 22 |
| -1.95 | 3.37 | 21 | 0.35 | 3.37 | 22 |
| -1.9 | 3.38 | 20 | 0.4 | 3.37 | 22 |
| -1.85 | 3.38 | 20 | 0.45 | 3.37 | 22 |
| -1.8 | 3.38 | 19 | 0.5 | 3.37 | 22 |
| -1.75 | 3.38 | 19 | 0.55 | 3.37 | 22 |
| -1.7 | 3.38 | 19 | 0.6 | 3.37 | 22 |
| -1.65 | 3.38 | 20 | 0.65 | 3.37 | 22 |
| -1.6 | 3.38 | 20 | 0.7 | 3.37 | 22 |
| -1.55 | 3.38 | 20 | 0.75 | 3.37 | 22 |
| -1.5 | 3.38 | 20 | 0.8 | 3.37 | 22 |
| -1.45 | 3.38 | 21 | 0.85 | 3.37 | 22 |
| -1.4 | 3.38 | 21 | 0.9 | 3.37 | 22 |
| -1.35 | 3.37 | 21 | 0.95 | 3.37 | 22 |
| -1.3 | 3.37 | 21 | 1 | 3.37 | 22 |
| -1.25 | 3.37 | 21 | 1.05 | 3.37 | 21 |
| -1.2 | 3.37 | 21 | 1.1 | 3.37 | 21 |
| -1.15 | 3.37 | 21 | 1.15 | 3.37 | 21 |
| -1.1 | 3.37 | 21 | 1.2 | 3.37 | 21 |
| -1.05 | 3.37 | 21 | 1.25 | 3.37 | 21 |
| -1 | 3.37 | 22 | 1.3 | 3.37 | 21 |
| -0.95 | 3.37 | 22 | 1.35 | 3.37 | 21 |
| -0.9 | 3.37 | 22 | 1.4 | 3.38 | 21 |
| -0.85 | 3.37 | 22 | 1.45 | 3.38 | 21 |
| -0.8 | 3.37 | 22 | 1.5 | 3.38 | 20 |
| -0.75 | 3.37 | 22 | 1.55 | 3.38 | 20 |
| -0.7 | 3.37 | 22 | 1.6 | 3.38 | 20 |
| -0.65 | 3.37 | 22 | 1.65 | 3.38 | 20 |
| -0.6 | 3.37 | 22 | 1.7 | 3.38 | 19 |
| -0.55 | 3.37 | 22 | 1.75 | 3.38 | 19 |
| -0.5 | 3.37 | 22 | 1.8 | 3.38 | 19 |
| -0.45 | 3.37 | 22 | 1.85 | 3.38 | 20 |
| -0.4 | 3.37 | 22 | 1.9 | 3.38 | 20 |
| -0.35 | 3.37 | 22 | 1.95 | 3.37 | 21 |
| -0.3 | 3.37 | 22 | 2 | 3.36 | 23 |
| -0.25 | 3.37 | 22 | 2.05 | 3.35 | 26 |
| -0.2 | 3.37 | 22 | 2.1 | 3.32 | 30 |
| -0.15 | 3.37 | 22 | 2.15 | 3.28 | 36 |
| -0.1 | 3.37 | 22 | 2.2 | 3.23 | 45 |
| -0.05 | 3.37 | 22 | 2.25 | 3.16 | 57 |
| 0 | 3.37 | 22 | 2.3 | 3.05 | 75 |

METHOD FOR PRODUCING A
RADIATION-EMITTING COMPONENT AND
RADIATION-EMITTING COMPONENT

RELATED APPLICATION

This is a U.S. National Phase Application under 35 USC §371 of International Application PCT/DE2008/001734 filed on Oct. 24, 2008.

This patent application claims the priorities of German Patent Application 10 2007 057 773.9 filed Nov. 30, 2007 and of German Patent Application 10 2007 061 458.8 filed Dec. 20, 2007, the disclosure content of both of which is hereby incorporated by reference.

FIELD OF INVENTION

The present application relates to a method for manufacturing a radiation-emitting component, as well as to a radiation-emitting component.

BACKGROUND OF THE INVENTION

In edge-emitting semiconductor lasers, the radiation exiting via the outcoupling facet may cause damage to this facet. Such damage, which leads to failure of the semiconductor laser, is referred to as "catastrophic mirror damage" (English: Catastrophic Optical Damage, COD). The higher the maximum luminance in the area of the facet, the greater the risk of such damage.

SUMMARY OF THE INVENTION

One object of the invention is to provide a method with which semiconductor lasers may be manufactured in which the danger of optical damage is reduced even at high output power. Another object of the invention is to provide such a laser.

In a method for manufacturing a radiation-emitting component according to one embodiment, a field distribution of a near field in a direction perpendicular to a main emission axis of the component is specified. From the field distribution of the near field, an index of refraction profile along this direction is determined, in particular, calculated. A structure is determined for the component such that the component will have the previously determined index of refraction profile. The component is constructed according to the previously determined structure.

The index of refraction profile of the component is therefore configured to be adapted in a targeted manner to a specified field distribution. In other words, the index of refraction profile may be calculated from the specified near field in such a manner that the component equipped with this index of refraction profile has the specified field distribution, or the component has at least an actual field distribution closely approaching this specified field distribution. In particular, a field distribution of the near field with a high homogeneity may be achieved in this way. The greater the homogeneity of the field distribution, the lower the maximum local optical field density appearing at a resonator interface may be for an identical total optical output power. The danger of component failure due to catastrophic optical damage may thereby be reduced.

The near field is understood to mean, in particular, the field distribution of the radiation that interacts with the active region of the radiation-emitting component provided for generating radiation, and/or appears overwhelmingly in the emission direction in a distance from the active region that lies in the range of the vacuum wavelength, in particular, less than or equal to the vacuum wavelength of the generated radiation. The field distribution at a resonator interface of the component such as a facet of a semiconductor laser may also be used.

In a preferred implementation, the index of refraction profile is determined from the near field according to the following proportionality relation:

$$n \sim [(n_{\mathit{eff}}^2 k^2 E_N(z) - E_N''(z))/(k^2 E_N(z))]^{1/2}$$

Here the z-axis runs perpendicular to the main emission axis of the component, wherein the main emission axis runs through the zero-point of the z-axis. $E_N(z)$ is the electromagnetic field of the near field, and $E_N''(z)$ is its second derivative. k is the wave vector of the electromagnetic radiation, and $n_{\mathit{eff}}$ is the effective index of refraction.

For the specified field distribution of the near field in another preferred implementation, the proportionality relation $$E_N(z) \sim \exp[-(z/d)^\alpha]$$

holds, where α is an even integer greater than two and d is a measure of the width of the specified field distribution of the near field. This function is also referred to as a top-hat function. In comparison with a Gaussian function, which would result for α=2, a top-hat function is distinguished by steeper flanks, running more and more steeply as the larger the exponent α increases. In addition, the top-hat function has a more sharply pronounced plateau-like contour around z=0 in the range z<d with larger exponents α.

In a preferred implementation, the radiation-emitting component has a semiconductor body with a semiconductor layer sequence wherein the semiconductor layer sequence further preferably comprises an active region provided for generating radiation. The semiconductor body with the semiconductor layer sequence is preferably deposited epitaxially, for example, by means of MBE or MOVPE.

In a preferred refinement, the component has field-shaping layers that are arranged at least on one side of the active region. In particular, the index of refraction profile may be formed by means of the field-shaping layers.

Further preferably, the index of refraction profile runs at least in part inside the semiconductor body with the semiconductor layer sequence.

In another preferred implementation, the index of refraction profile is formed by means of a suitable material composition along the vertical direction, i.e., along a deposition direction for the semiconductor layer sequence of the semiconductor body The semiconductor layers of the semiconductor layer sequence preferably contain at least in part a ternary, quaternary or quinary compound semiconductor. In such compound semiconductors, the index of refraction of the material is easily adjustable by means of the material composition. A semiconductor body with the previously determined index of refraction profile may therefore be formed by depositing semiconductor layers with different indices of refraction. The index of refraction inside a semiconductor layer need not necessarily be constant in this regard. For example, the index of refraction of the semiconductor layer may also have a gradient or may increase or decrease incrementally.

Alternatively, the index of refraction profile may be formed by structuring the component, in particular, the semiconductor body, along a lateral direction, i.e., along a direction running in a main extension plane of the semiconductor layers in the semiconductor body. In this manner, the near field may be shaped in the lateral direction. The index of refraction profile preferably runs perpendicular to the main emission axis.

The structuring may be formed by means of recesses, for example. These recesses may extend into the semiconductor body.

In another preferred implementation, the field distribution of the near field is specified along an additional direction perpendicular to the main emission axis of the component. The near field may thus be specified along two axes running at an incline or perpendicular to one another. Based on the specified field distribution of the near field along this additional direction, an additional index of refraction profile perpendicular to the main emission axis and inclined or perpendicular to the index of refraction profile may be determined. In this case, the index of refraction profile runs parallel to the first axis, and the additional index of refraction profile runs parallel to the second axis. Subsequently the structure of the component may be determined in such a manner that the component exhibits the previously determined additional index of refraction profile.

The additional index of refraction profile may likewise be calculated from the specified near field according to the formula listed in connection with the index of refraction profile.

The determined additional index of refraction profile may be implemented, in particular, by structuring the semiconductor body in the lateral direction and in the direction perpendicular to the main emission axis.

In a preferred refinement, the index of refraction profile is formed by means of a suitable material composition along the deposition direction for the semiconductor layer sequence of the semiconductor body, and the additional index of refraction profile is formed by means of recesses in the component, in particular, in the semiconductor body. In particular, the recesses may extend into the field-shaping layers. In that manner, the near field may be shaped along the vertical direction by means of the field-shaping layers, and along the lateral direction by means of the recesses.

The recesses may be formed by removal of material from the semiconductor body with the semiconductor layer sequence, for example, mechanically and/or chemically, by means of wet chemical or dry chemical etching.

The recesses may subsequently be filled at least in certain areas with a material that has a larger or smaller index of refraction than the material in which the recesses are formed.

The filling may be done by means of epitaxial overgrowth, for example. Thus, the index of refraction may be varied within wide boundaries by means of the material composition of the epitaxial filler material.

Alternatively or additionally, the recesses may be filled by vapor deposition or sputtering. In this case, the additional epitaxy process for overgrowth may be omitted. For example, the filler material may be a dielectric material such as an oxide, a nitride or an oxynitride.

According to one embodiment, a radiation-emitting component with an active region provided to generate radiation has a main emission axis and an index of refraction profile perpendicular to the main emission axis. The index of refraction profile is configured in such a manner that, because of the index of refraction profile, a field distribution of a near field of the radiation generated in the operation of the component has a higher homogeneity than a Gaussian field distribution.

The higher homogeneity is achieved by the targeted formation of the index of refraction profile in such a manner that the resulting near field corresponds to or at least approximates the specified homogeneous near field. Thereby the radiation density at a resonator interface, particularly one perpendicular to the main emission axis, which may serve for example as a mirror surface and/or a radiation exit surface, may be configured very homogeneously. In other words, the overall radiation power striking the resonator interface is distributed better across the resonator interface. The maximal occurring local radiation power density may thus be reduced for an equal overall radiation power. Consequently, the risk of radiation-induced damage to the resonator interface, which may occur particularly at the point of maximum radiation power density, may be reduced.

In particular, the maximum occurring radiation power density may be reduced without the necessity to increase the surface area impacted by the radiation for this purpose. Elevated threshold currents and elevated series resistances induced by an enlargement of the surface area may be avoided, contrasting in particular with lasers having widened waveguides. Such lasers with widened waveguides are also referred to as LOC (large optical cavity) lasers or SLOC (super-large optical cavity) lasers. An undesired increased occurrence of higher-order lateral optical modes may also be more easily avoided or at least reduced, in comparison to those lasers. A monomode operation is therefore facilitated.

In a preferred implementation, the index of refraction profile increases from the main emission axis at least on one side, preferably on both sides, of the main emission axis with increasing distance from the main emission axis to at least a local maximum value. The near field may be especially efficiently shaped in this manner. The maximum value may be a local or a global maximum.

According to another embodiment, a radiation-emitting component with an active region provided to generate radiation has a main emission axis and an index of refraction profile perpendicular to the main emission axis. The index of refraction profile increases from the main emission axis at least on one side of the main emission axis with increasing distance from the main emission axis to a maximum value.

In such a component the emitted radiation may have an especially homogeneous field distribution in the near field.

In a preferred refinement of the additional embodiment, the index of refraction profile is configured in such a manner that, because of the index of refraction profile, a field distribution of the near field of the radiation generated in the operation of the component has a higher homogeneity than a Gaussian field distribution. The maximum optical power density at the radiation exit surface may thus be reduced.

A homogeneous near field is understood, in particular, to mean a near field that has as constant a distribution of intensity as possible in a given area and additionally does not fall below a specified threshold value. The more homogeneously the total radiation power is distributed across the radiation exit surface, the smaller the maximum optical power density may be for an equal overall power density and an equal size of the exit surface.

In particular, the surface area of a rectangle with maximum surface area that fits under a curve of the intensity distribution may be used as a measure for the homogeneity of the near field. The near field in this case is the intensity of the radiation emitted from the radiation-emitting component as a function of the distance x from the main emission axis. For a near field with a Gaussian distribution, the maximum rectangle surface area amounts to 48.4%.

A radiation-emitting component in which the near field, particularly at the position of the radiation exit surface, has a higher homogeneity than a Gaussian field distribution is particularly suited for high output powers, preferably 100 mW or more.

In a preferred implementation, a rectangle with maximum surface area that fits under a curve of the intensity profile of the near field fills at least 50%, especially preferably at least 60%, and most preferably at least 65% of the total surface area under the curve of the near-field intensity profile. The greater this surface area is, the lower the locally appearing maximum power density may be for an equal overall optical output power. The intensity profile here is the distribution of the near field along the direction running parallel to the index of refraction profile.

In another preferred implementation, the index of refraction decreases with increasing distance from the main emission axis, from the maximum value to a value smaller than the index of refraction in the area of the main emission axis.

In a preferred refinement, the index of refraction profile is formed symmetrically or at least largely symmetrically to the main emission axis. A shaping of the near field according to a specified distribution may thus be achieved more simply.

In a preferred refinement, the index of refraction profile decreases, starting from the maximum value, towards the main emission axis more slowly than in a direction away from the main emission axis.

Further preferably, the index of refraction profile is shaped at least in certain areas according to the square root of a polynomial with even-numbered exponents, wherein 0 is also considered an even number. In particular, the polynomial may have the form $$A + B*z^\beta - C*z^\gamma$$

where A, B and C are positive coefficients and $\beta$ and $\gamma$ are positive even numbers with $\gamma > \beta$. The curve of such a polynomial first increases with increasing distance z from a value A to a maximum value, and then decreases comparatively sharply.

For a near field distribution shaped according to a top-hat function with exponents $\alpha$, the square root from the above polynomial represents an analytical solution for the index of refraction profile, so that the following relation results $$n(z) = (A + B*z^{\alpha-2} - C*z^{2\alpha-2})^{1/2}.$$

For example, a top-hat function with $\alpha=4$ leads to polynomial exponents $\beta=2$ and $\gamma=6$, while with $\alpha=8$, the exponents $\beta=6$ and $\gamma=14$ result.

The coefficient A may be determined from the square of the effective index of refraction, i.e., from $n_{eff}^2$. The coefficients B and C may be determined from the relations $$B = (\alpha^2 - \alpha)/(k_{eff}^2 d^\alpha) \text{ and}$$

$$C = \alpha^2/(k_{eff}^2 d^{2\alpha})$$

The effective wave number $k_{eff}$ is linked to the vacuum wavelength $\lambda$ of the propagating radiation by the relation $k_{eff} = 2\pi n_{eff}/\lambda$.

In particular, the index of refraction profile agrees with the described distribution particularly in regions in which the field of the optical mode significantly overlaps in the lateral direction. In areas into which only outliers of the optical mode extend, the index of refraction profile may also deviate from this.

Within the scope of the application, the index of refraction profile is understood to mean the basic distribution of the index of refraction on a scale relevant to the formation of the electromagnetic radiation field. In particular, thin layers whose index of refraction deviates from the adjoining layers do not have a substantial effect on the field formation in a semiconductor laser, and therefore need not be taken into consideration for the index of refraction profile. Thin layers in this sense are, in particular, quantum layers of the active area of semiconductor lasers that are so thin that quantization effects from charge carriers may occur. The thickness of such quantization layers is usually less than 20 nm.

A semiconductor laser in which an active region with one or more quantum layers is embedded in a waveguide with constant material composition is therefore considered to be a semiconductor laser having a constant index of refraction profile in the waveguide, even if the index of refraction of the quantum layers is different from the index of refraction of the adjoining material of the waveguide.

Such a semiconductor laser with constant index of refraction profile in the region of the waveguide has a resulting near field whose distribution is proportional to $\sin^2(z)$ or $\cos^2(z)$. Together with the outliers of the near field into the cladding layers between which the waveguide runs, this therefore yields a distribution that largely corresponds to a Gaussian field distribution. Exponentially decreasing near fields may also be caused by quantum wells of the active region that are separated from one another. Because of a comparatively low homogeneity of the near field, the risk of catastrophic optical damage is elevated for such semiconductor lasers.

In a preferred implementation, the index of refraction profile is formed by means of field-shaping layers that are arranged at least on one side of the active region, preferably on both sides of the active region. It is further preferred that the maximum value of the index of refraction profile is formed in one of the field-shaping layers.

In a preferred refinement, the active region is arranged between cladding layers. The cladding layers preferably have an index of refraction that is less than the index of refraction in the area of the main emission axis.

It is further preferred that the field-shaping layers be arranged between the cladding layers. The index of refraction of the field-shaping layers is expediently higher, at least in certain areas, than the index of refraction of the cladding layers. Thus the lateral propagation of the radiation generated in the active region may be confined, at least in large part, to the area between the cladding layers.

In a preferred implementation, the component has a semiconductor body with a semiconductor layer sequence. The active region is preferably fanned in the semiconductor body. In addition, the field-shaping layers may also be formed, at least in part, in the semiconductor body. The cladding layers may also be integrated into the semiconductor body or may be arranged completely or in part outside the semiconductor body.

The index of refraction profile is preferably formed completely or, at least in part, in the semiconductor body. Thus, the near field may be shaped inside the semiconductor body, at least to a large extent.

In an implementation variant, the index of refraction profile runs perpendicular to a main extension direction of the semiconductor layers in the semiconductor body. The index of refraction profile thus runs along a deposition direction of the semiconductor layers in the semiconductor body.

In an additional preferred refinement, the field-shaping layers each contain a compound semiconductor material. It is further preferred that the index of refraction profile be formed by means of a variation of the composition of the compound semiconductor material. Due to the dependence of the index of refraction on the material composition, it is thus possible to determine the necessary profile for the material composition from the ascertained index of refraction profile. The relative variation of this material composition between the area around the main emission axis and the area around the maximum value is preferably between 1% and 40% inclusively, especially preferably, between 5% and 15% inclusively.

In another preferred implementation, the maximum value of the index of refraction profile is formed in one of the field-shaping layers. Field shaping for the near field is facilitated in this manner.

In another implementation variant, the index of refraction profile runs in a main extension direction of the semiconductor layers in the semiconductor body. Thus, the near field of the radiation produced in operation may be shaped in a targeted manner in the lateral direction.

Such an index of refraction profile running in the lateral direction may be formed, for example, by means of recesses. These recesses may extend into the semiconductor body.

In a preferred implementation, the radiation-emitting component has an additional index of refraction profile perpendicular to the main emission axis and perpendicular to the index of refraction profile. By means of this additional index of refraction profile, a targeted shaping of the field distribution of the near field along a second spatial direction may be achieved, particularly inside the semiconductor body. A two-dimensionally homogeneous distribution of the entire radiation power across the resonator interface, such as the radiation exit surface, is facilitated in this manner. The risk of catastrophic optical damage is thereby further reduced.

The additional index of refraction profile may have at least one of the features mentioned in connection with the index of refraction profile.

In another preferred implementation, the index of refraction profile runs perpendicular to the main extension direction of the semiconductor layers in the semiconductor body, and the additional index of refraction profile is formed by means of recesses.

The recesses preferably extend into the semiconductor body, in particular, into the field-shaping layers. The recesses may additionally extend from a surface of the semiconductor body running parallel to the active region into the latter.

The average index of refraction for the radiation oscillating parallel to the main emission axis may be adjusted along that direction by means of the recesses.

In a preferred refinement, the recesses are filled with a filler material, at least in part. The filler material may have a lower index of refraction than the material in which the recesses are formed, for example, the semiconductor material adjoining the recesses. In comparison with the index of refraction of the semiconductor material, the average index of refraction may be modified, in particular, locally reduced, in a targeted manner by means of the recesses.

Alternatively, the filler material may have a higher index of refraction than the material in which the recesses are formed, for example, the semiconductor material adjoining the recesses. In comparison with the index of refraction of the semiconductor material, the average index of refraction may be modified, in particular, locally increased, in a targeted manner by means of the recesses.

The recesses may be formed only on one side of the active region, or on both sides of the active region. The active region is preferably free of recesses. An efficient generation of radiation in the active region may thus be achieved in an improved matter.

In another preferred implementation, the radiation-emitting component has an additional active region provided for generating radiation. The overall radiation power exiting the component may thereby be increased.

A tunnel region may be framed between the active region and the additional active region. The active region and the additional active region may be connected electrically to one another in series by means of this tunnel region. The tunnel region is preferably formed by means of two semiconductor layers each configured with high doping of opposite polarities. The dopant concentration in each case is preferably at least $10^{18}$ cm$^{-3}$, especially preferably at least $10^{19}$ cm$^{-3}$.

The radiation generated in the active region and the radiation generated in the additional active region may have a common transversal optical mode. These radiation components may therefore be coherently coupled.

In one implementation variant, the additional active region is arranged, with respect to the index of refraction profile, between the main emission axis and the position of the maximum value of the index of refraction profile. A shaping of the common transversal mode is facilitated in this manner.

In an alternative implementation variant, the position of the maximum value of the index of refraction profile is arranged between the main emission axis and the additional active region. An additional cladding layer may be arranged between the active region and the additional active region. The intensity of the optical coupling may be adjusted by means of the thickness of the additional cladding layer. The tunnel region may be formed in the additional cladding layer. An absorption in the tunnel region of the radiation generated in the active region may be largely reduced in this manner.

In this case, an additional main emission axis is associated with the additional active region, wherein the index of refraction profile on the side of the additional main emission axis facing away from the main emission axis increases with increasing distance from the additional main emission axis to an additional maximum value.

In this case, the distribution of the index of refraction profile relative to the additional main emission axis may have at least one of the features described in connection with the distribution of the index of refraction profile relative to the main emission axis.

Additional field-shaping layers may also be associated with the additional active region. The field-shaping layers associated with the active region and the additional field-shaping layers associated with the additional active region may be formed identically. Deviating from this, the field-shaping layers and the additional field-shaping layers may differ from one another and, in particular, may be adapted to the active region and the additional active region, respectively. The active region and the additional active region may also be provided for emission of radiation with different wavelengths.

The active region and/or the field-shaping layers preferably contain a compound semiconductor material, especially preferably a III-V compound semiconductor material, particularly from the (AlInGa)(AsPNSb) material combination, i.e., a combination of at least one of the listed elements of Group III of the periodic table with one of the listed elements of Group V of the periodic table. The material may be selected, in particular, from the group consisting of $Al_xIn_yGa_{1-x-y}As$, $Al_xIn_yGa_{1-x-y}P$, $Al_xIn_yGa_{1-x-y}N$ and $Al_xIn_yGa_{1-x-y}Sb$, each with $0 \leq x \leq 1$, $0 \leq y \leq 1$ and $x+y \leq 1$. With these materials, radiation may be efficiently generated from the ultraviolet, through the visible and into the infrared spectral range.

The described configuration of the index of refraction profile for homogenizing the near field, and thereby reducing the risk of catastrophic optical damage to resonator surfaces, is applicable in principle to all coherent emitters.

The radiation-emitting component is preferably constructed as an edge-emitting semiconductor laser component. In an edge-emitting semiconductor laser component, the main emission axis runs parallel to the main extension plane of the semiconductor layers in the semiconductor body.

A construction of the radiation-emitting component as a surface-emitting semiconductor laser component, such as a VCSEL (vertical cavity surface-emitting laser), a VECSEL (vertical external cavity surface-emitting laser) or a disk laser, is also conceivable. In a surface-emitting semiconductor laser component, the main emission axis of the component runs perpendicular to the main extension plane of the semiconductor layers in the semiconductor body.

The method described above is especially suitable for manufacturing a semiconductor chip. Characteristics discussed in connection with the radiation-emitting component may therefore also be used for the method, and vice versa.

BRIEF DESCRIPTION OF THE DRAWINGS

FIGS. 2A-2E show a field distribution E(z) of a specified near field (FIG. 2A), an index of refraction profile n(z) (FIG. 2B), a profile of the material composition (FIG. 2C), a schematic sectional view of a radiation-emitting component (FIG. 2D) and an associated distribution of the index of refraction and material composition in table form (FIG. 2E) for intermediate steps of a second embodiment of a method for manufacturing a radiation-emitting component.

DETAILED DESCRIPTION OF THE DRAWINGS

Identical, similar and identically functioning elements are provided with identical reference numbers in the figures.

The figures are schematic representations in each case and are therefore not necessarily true to scale. Instead, relatively small elements and, in particular, layer thicknesses may be represented exaggerated in size for clarification.

Figure 1A:
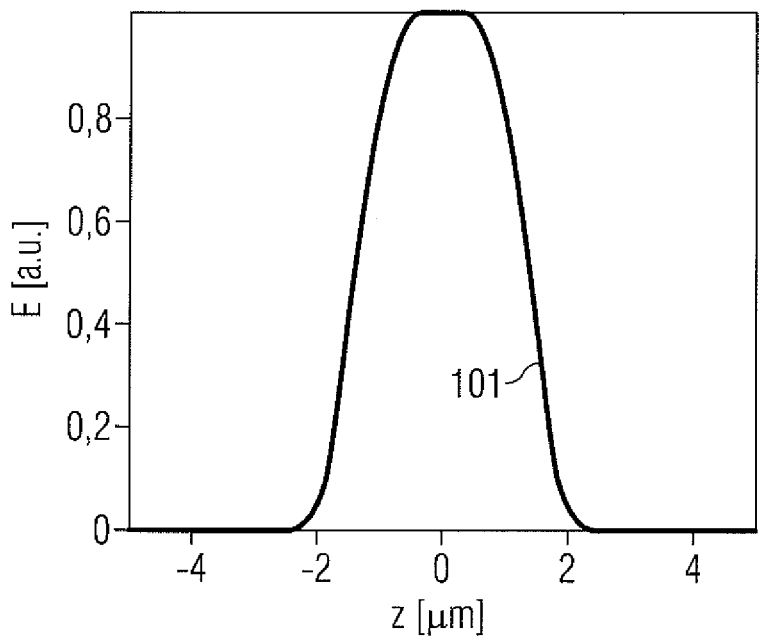
FIGS. 1A-1D show a field distribution E(z) of a specified near field (FIG. 1A), an index of refraction profile n(z) (FIG. 1B), a profile of the material composition (FIG. 1C) and a schematic sectional view of a radiation-emitting component (FIG. 1D) for intermediate steps of a first embodiment of a method for manufacturing a radiation-emitting component.

FIG. 1A shows a profile of the field distribution E of a specified near field for the radiation-emitting component, as a function of the distance z from a main emission axis of the radiation-emitting component. The z-axis thus runs perpendicular to the direction in which the radiation-emitting component emits radiation during operation. In this embodiment, the near field has the profile of a top-hat function with $\alpha=4$.

In comparison with a Gaussian distribution, the specified field distribution is distinguished by a greater homogeneity.

From the specified near field profile, it is possible to calculate an index of refraction profile that leads to the specified near field profile.

Figure 1B:
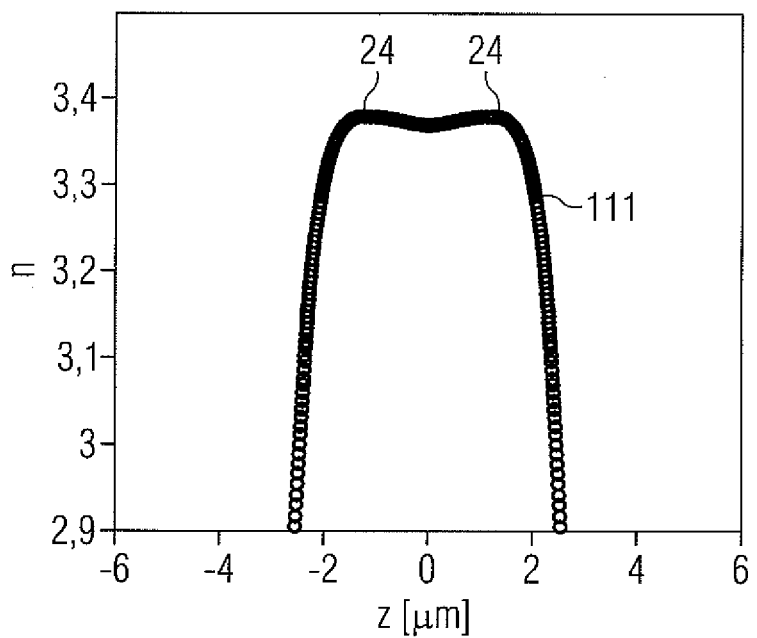

For the top-hat function of FIG. 1A, with $\alpha=4$, the index of refraction profile n(z) may be determined analytically and results as $$n(z)=(A+B*z^2-C*z^6)^{1/2},$$

with the above-described values for the parameters A, B and C. The corresponding profile is shown in FIG. 1B.

Starting from the main emission axis, the index of refraction profile initially increases continuously and rises on both sides of the main emission axis to a maximum value 24. Subsequently the index of refraction profile decreases comparatively sharply and takes on a value that lies below the value of the index of refraction profile in the area of the main emission axis.

The index of refraction profile determined in this manner may be calculated into a profile of the material composition. This calculation depends on the respective material provided for the component.

Figure 1C:
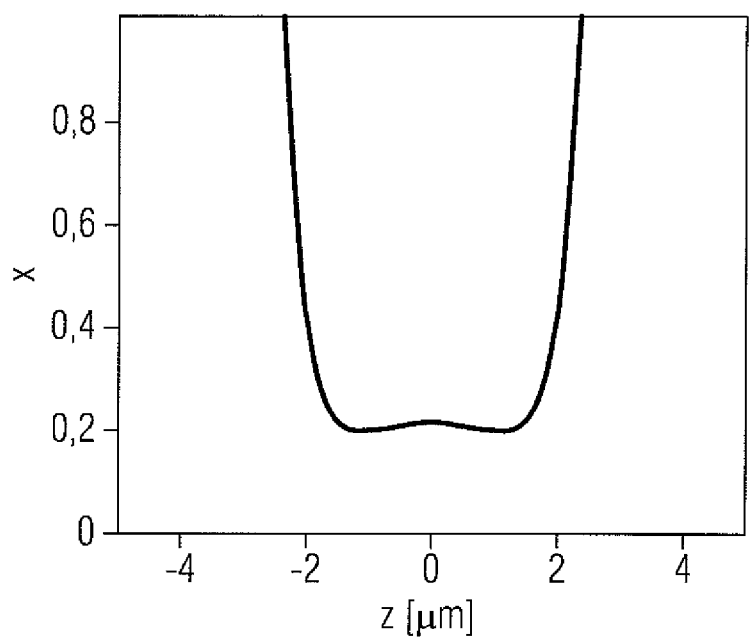

FIG. 1C shows as an example the profile of the aluminum content x for a semiconductor layer sequence based on $Al_xGa_{1-x}As$. With a profile for the aluminum content configured correspondingly to FIG. 1C, the index of refraction profile shown in FIG. 1B may thus be implemented. For $Al_xGa_{1-x}As$, the index of refraction increases with increasing aluminum content x. Accordingly, the aluminum content has a minimum value at the site of the maximum value for the index of refraction.

The relative variation of the material composition between the area around the main emission axis and the area around the maximum value is preferably between 1% and 40% inclusively, especially preferably between 5% and 15% inclusively. The electrical properties of the radiation-emitting component are only slightly influenced by the variation of the material composition.

The component may be formed based on the structure determined in this manner

As the field distribution of the near field in FIG. 1A shows, the near field has values different from zero practically only in a range between $-2$ μm and 2 μm around the main emission axis. In other words, the field strength outside this range is negligible. For the radiation-emitting component that is to be manufactured, it is therefore sufficient to implement the index of refraction profile and thus the distribution of the material composition calculated therefrom only in this range. For larger values of z, the intensity of the near field is so small an optimally exact recreation of the calculated index of refraction profile may be dispensed with.

Figure 1D:
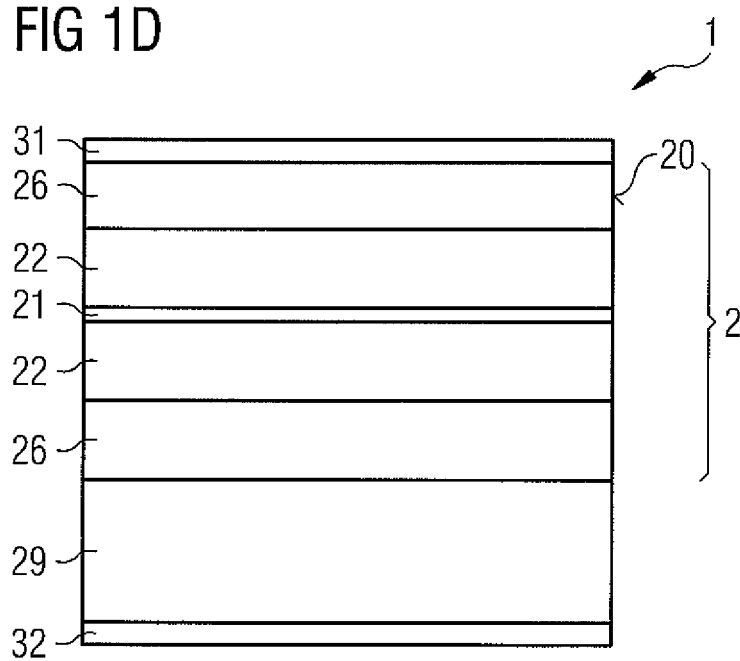

In FIG. 1D, such a radiation-emitting component 1 is shown schematically in a sectional view. The radiation-emitting component has a semiconductor body 2 with a semiconductor layer sequence. The semiconductor layer sequence forms the semiconductor body and is preferably produced epitaxially, for example, by means of MOVPE or MBE. The semiconductor layer sequence of semiconductor body 2 is arranged on a carrier 29. Carrier 29 may be the growth substrate upon which the semiconductor layer sequence of the semiconductor body was deposited. Departing from this, the carrier may also be different from the growth substrate. It therefore need not meet the demands placed on the growth substrate, particularly with regard to crystalline purity, in this case, but may instead be selected with regard to other properties such as thermal and/or electrical conductivity, or mechanical stability.

The semiconductor body has an active region 21 that is provided for the generation of, preferably, coherent radiation during the operation of the semiconductor body. On both sides of the active region, a contact layer 31 or an additional contact layer 32 is arranged. The contact layers preferably serve for external electrical contacting of semiconductor body 2. The contact layers are preferably constructed of metal and may contain, for example, Au, Ti, Pt, Al or Ag. In the operation of the radiation-emitting component, charge carriers may be injected via the contact layers 31, 32 from two different sides into the active region, where they recombine, emitting radiation.

A field-shaping layer 22 is arranged on both sides of the active region 21. A cladding layer 26 is arranged on the respective sides of field-shaping layers 22 facing away from the active region. The cladding layers preferably have an index of refraction that is less than the index of refraction of field-shaping layers 22.

The cladding layers may have a thickness of roughly 1000 nm, for example, and may each contain $Al_xGa_{1-x}As$, preferably with $x \geq 0.40$, especially preferably $x \geq 0.55$. The aluminum content may even have values of $x \geq 0.75$. The aluminum content of cladding layers 26 is preferably higher than the aluminum content of field-shaping layers 22 in the area of the main emission axis.

Radiation oscillating in the semiconductor body may thus be confined vertically, i.e., perpendicular to the main extension plane of the semiconductor layers, in large part to the area between cladding layers 26.

Departing from the illustrated embodiment, the cladding layers may also be arranged completely or at least in part outside the semiconductor body. For example, the cladding layers may be formed by means of dielectric layers deposited on semiconductor body 2.

Semiconductor body 2 further comprises a side surface 20 that delimits the semiconductor body in the lateral direction, i.e., along a main extension direction of the semiconductor layers of semiconductor body 2. At least one of the side surfaces 20 of semiconductor body 2 is provided for outcoupling of the coherent radiation generated in the operation of radiation-emitting component 1, and consequently serves as the radiation passage surface. Radiation-emitting component 1 is constructed in this case as an edge-emitting semiconductor laser component.

Side surfaces 20 may be produced chemically, by means of wet chemical or dry chemical etching, for example, or mechanically, by means of cleaving or breaking, for example.

All semiconductor materials with which electromagnetic radiation may be generated are basically suitable for active region 21.

Radiation-emitting component 1, in particular active region 21 and/or the field-shaping layers 22, preferably contains III-V compound semiconductor material, particularly from an (AlInGa)(AsPNSb) material combination, wherein the compound semiconductor material contains at least one of the listed elements of Group III of the periodic table and at least one of the listed elements of Group V of the periodic table.

III-V compound semiconductor materials are particularly suited for generating radiation from the ultraviolet ($Al_xIn_yGa_{1-x-y}N$), through the visible ($Al_xIn_yGa_{1-x-y}N$, particularly blue to green radiation, or $Al_xIn_yGa_{1-x-y}P$, particularly yellow to red radiation) and into the infrared ($Al_xIn_yGa_{1-x-y}As$, $Al_xIn_yGa_{1-x-y}Sb$) spectral range. In each case, here $0 \leq x \leq 1$, $0 \leq y \leq 1$ and $x+y \leq 1$, particularly with $x \neq 1$, $y \neq 1$, $x \neq 0$ and/or $y \neq 0$. With III-V semiconductor materials, particularly from the above-mentioned material systems, high internal quantum efficiencies in radiation generation may also be obtained.

Active region 21 preferably contains a quantum structure. The quantum structure here may comprise a quantum layer or two or more quantum layers.

Within the scope of the present application, the term quantum structure comprises any structure in which charge carriers may experience a quantization of their energy states due to enclosure confinement. In particular, the term quantum structure does not contain any information on the dimensionality of the quantization. It therefore includes, among other things, quantum wells, quantum wires and quantum dots, as well as any combination of these structures.

For an emission in the near-infrared, at an emission wavelength of 1 μm for example, an active region with a quantum layer that has a thickness of 10 nm and is based on $In_{0.14}Ga_{0.86}As$ is suitable. The peak wavelength of the radiation generated in the active region may be adjusted by varying the layer thickness and/or the indium content.

The semiconductor layers adjoining active region 21 are expediently n-doped on one side of active region 21 and p-doped on the other side of the active region. For example, the semiconductor layers arranged between active region 21 and carrier 29 may be n-doped, and the semiconductor layers arranged on the side of the active region facing away from carrier 29 may be p-doped. Charge carriers, i.e., electrons and holes, may thus be injected more easily from both sides of active region 21, where they recombine, emitting radiation.

Carrier 29 is expediently electrically conductive. A carrier based on semiconductor material, such as GaAs, Ge, Si or GaP, is expediently doped in the same manner as the semiconductor layers 22, 26 arranged between carrier 29 and active region 21

Departing from this, the carrier may also be formed to be electrically insulating. In this case, additional contact layer 32 is expediently arranged on the side of carrier 29 facing active region 21.

The main emission axis need not necessarily run through the active region. Active range 21 may also be arranged asymmetrically to the distribution of the index of refraction profile, i.e., at a position $z \neq 0$.

A symmetrical arrangement leads to a comparatively large overlap of the active region with optical modes of unevennumbered order which are distinguished by a maximum of the optical radiation power in the area of the main emission axis. The greater this overlap, the higher the so-called confinement factor.

The suppression of even-numbered modes is facilitated by the symmetrical arrangement. In this way, a single-mode operation, in which only the first-order transversal mode oscillates, may be easily achieved. A superimposition of a less homogeneous mode on the near field of the first order mode, which has the above-described particularly homogeneously specified distribution, may thus be avoided or at least reduced.

Even with an asymmetrical arrangement of active region 21, an operation in the fundamental optical mode may be achieved.

Suppression of higher-order modes may be further promoted by a high doping of cladding layers 26 and/or the outer areas of field-shaping layers 22, since the higher-order modes have a greater overlap with areas further removed from the main emission axis than do lower-order modes. The losses caused in this way result in higher threshold values for initial oscillation of these undesired higher-order modes.

By means of the method described in this embodiment, the index of refraction profile 111 is achieved by suitably varying the material composition of the semiconductor layer sequence of semiconductor body 2 along the deposition direction, i.e., perpendicular to the main extension direction of the semiconductor layers of semiconductor body 2. The index of refraction profile 111 resulting thereby brings about a targeted shaping of the near field. Thus a near field may be produced that has a high homogeneity in the area of side surface 20. The maximum optical power density appearing at the side surface may thus be reduced, with an equal overall output power of the radiation generated in the active region there. The risk of damage to the side surfaces, which may lead to destruction of the component, is thereby reduced.

Compound semiconductor materials for which the refractive index may be adjusted by means of a variation of the composition of the semiconductor material are particularly suitable for the field-shaping layers 22.

In this way, a radiation-emitting component may be produced whose emitted radiation has a greater homogeneity in the near field than a component with a Gaussian near field.

A rectangle with maximum surface area that fits under the curve of the intensity profile of the near field as a function of the distance from the main emission axis preferably fills at least 50%, especially preferably at least 60%, and most preferably at least 65% of the total surface area under the curve of the near-field intensity distribution.

Such a radiation-emitting component is especially suitable as a laser with a high output power, roughly 100 mW or more, preferably 1 W or more.

An additional embodiment of a method for manufacturing a radiation-emitting component 1 will be explained with reference to FIGS. 2A-2E. This second embodiment substantially corresponds to the first embodiment described in connection with FIGS. 1A-1D. Unlike the latter, the specified field distribution of near field 201 is defined by a top-hat function with α=8. In contrast to the distribution illustrated in FIG. 1A, the field distribution here is further homogenized. The plateau-like behavior about z=0 is more pronounced. The field distribution declines even more quickly on the flanks.

For the field distribution of near field 201 shown in FIG. 2A, it is again possible to determine the index of refraction profile 211 with which this specified distribution of the near field may be achieved. The analytical solution here is expressed by $$n(z)=(A+B*z^6-C*z^{14})^{1/2},$$

where the coefficients A, B and C take on the values already specified above.

Index of refraction profile 211 again shows a distribution in which the index of refraction increases starting from the main emission axis on both sides to a maximum value of 24. In the direction away from the maximum value towards larger values of z, the index of refraction decreases even more sharply than in the profile shown in FIG. 1B.

Figure 2A:
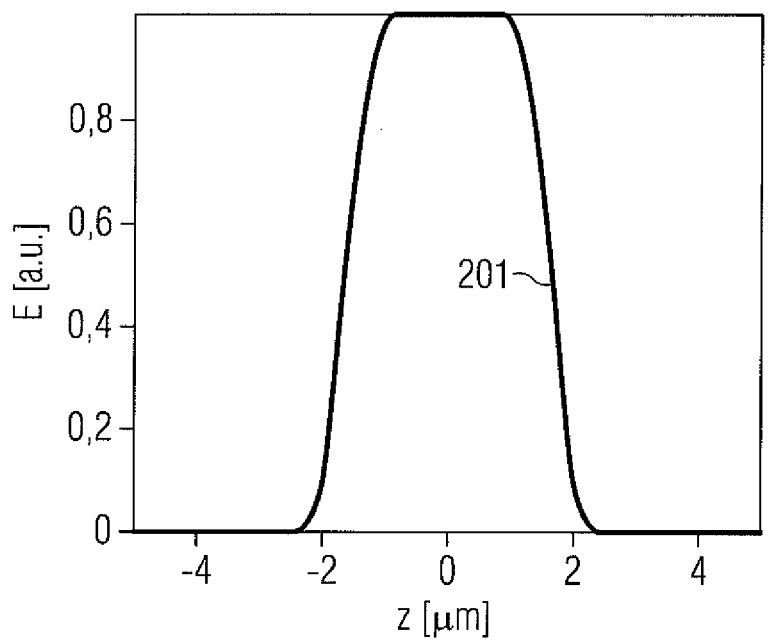
Figure 2B:
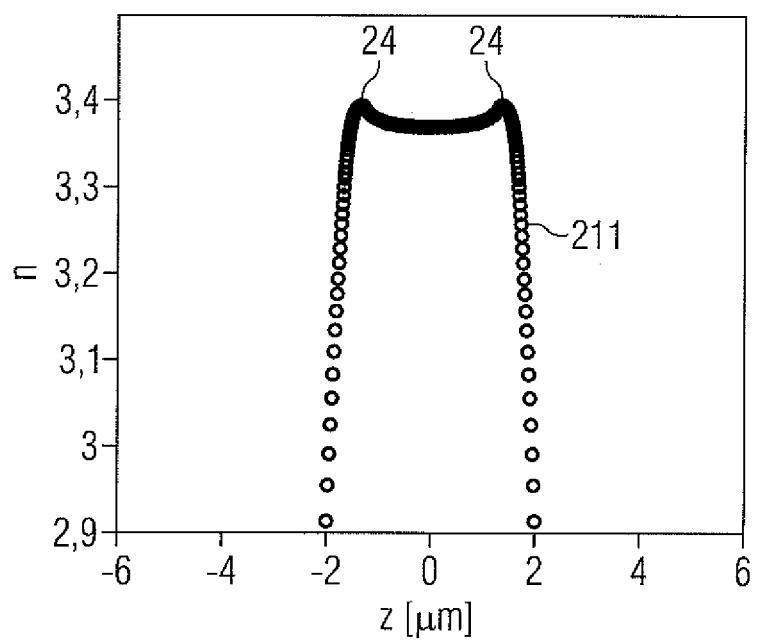
Figure 2C:
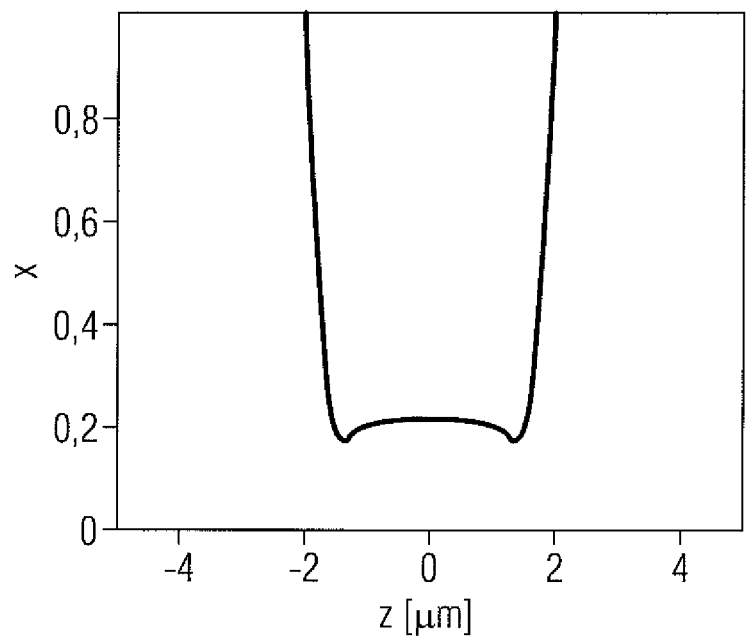

As described in connection with FIGS. 1B and 1C, the required material composition in the desired material system may be determined from the index of refraction profile. The resulting aluminum content x for the $Al_xGa_{1-x}As$ material system is shown in FIG. 2C. The maximum values of the index of refraction profile again correspond to the minimum values for the aluminum content.

Figure 2D:
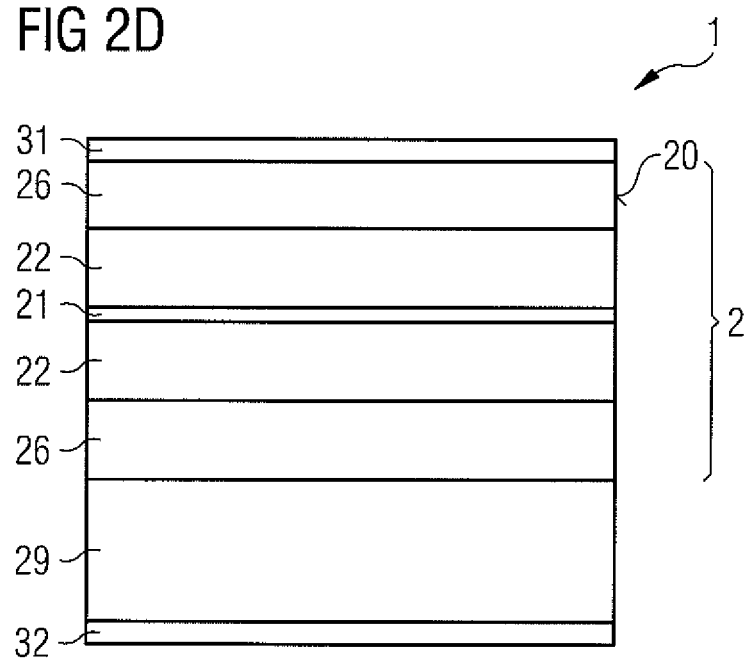

The structure of the radiation-emitting component 1 illustrated in FIG. 2D substantially corresponds to the radiation-emitting component described in connection with FIG. 1D. The components differ particularly by the index of refraction profile and the associated profile of the aluminum content along the deposition direction of the semiconductor layer sequence, especially in the area of field-shaping layers 22.

By means of the index of refraction profile as described, with the more pronounced maximum values in the peripheral area of the field-shaping layers 22, it is possible to achieve a near field in the operation of component 1 that is distinguished by an improved homogeneity. The maximum optical power density occurring at side surfaces 20 may be further reduced in this way, with an identical overall radiation power. The risk of catastrophic optical damage is thus even more sharply reduced.

The distribution of the refractive indices n and the aluminum content x for field-shaping layers 22 is illustrated in tabular form in FIG. 2E. The active region 21 is arranged at the point of the main emission axis, i.e., at z=0. The quantum layer, which is based on $In_{0.14}Ga_{0.86}As$ and has a thickness of 10 nm, has an index of refraction of roughly 3.60. Because of the small thickness, however, this quantum layer has no effect or only a negligible one on the index of refraction profile, which is crucial for the field distribution of the near field. The quantum layer of active region 21 is therefore not taken into account in the table.

Starting from z=0, the index of refraction rises in both directions to a maximum value, which is achieved at z=±1.75 μm and is roughly 3.38. This is accomplished by a reduction of the Al content from 22% in the central area about the main emission axis to 19% at z=±1.75 μm. Subsequently, the index of refraction declines to a value of 3.05 for z=±2.3 μm, which corresponds to an aluminum content of x=75%. The adjoining cladding layers preferably have an index of refraction that at most is as large as the index of refraction at the boundary of the field-shaping layers, i.e., at most 3.05 in the present example.. The aluminum content accordingly is preferably at least 75% and may assume values up to 100%.

Figure 3A:
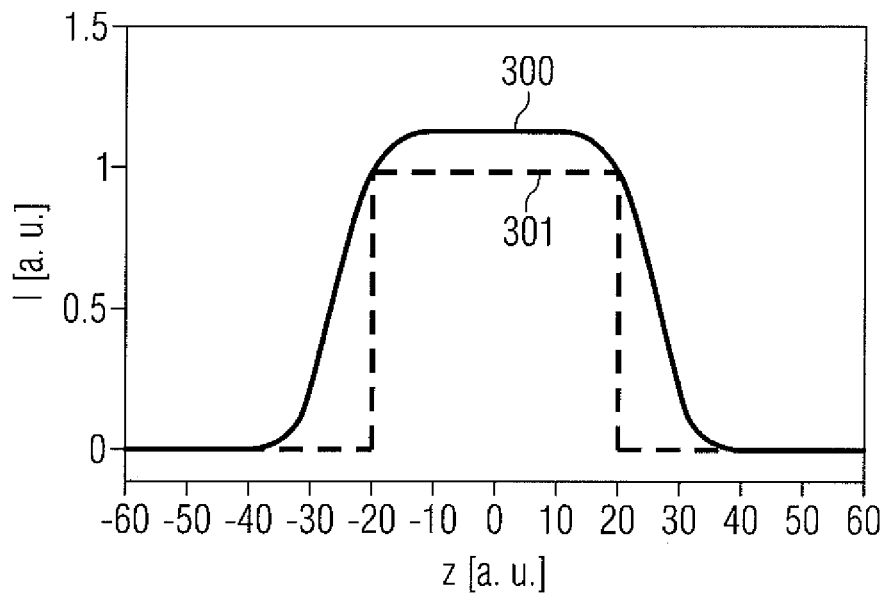
FIG. 3A shows an intensity distribution I of the near field for an optoelectronic component according to the second embodiment as a function of the distance z from the main emission axis.

The intensity distribution of a near field as a function of the distance z (in arbitrary units) from the main emission axis of the component described in connection with FIGS. 2A-2E is illustrated in FIG. 3A. The intensity distribution 300 exhibits a plateau-like profile in a range of roughly ±15, in which the intensity practically does not change. The dash-line 301 here constitutes the border of a rectangle with maximum surface area that fits under the intensity distribution 300. In this case, the rectangle fills up roughly 68.8% of the surface area underneath the intensity curve 100.

Figure 3B:
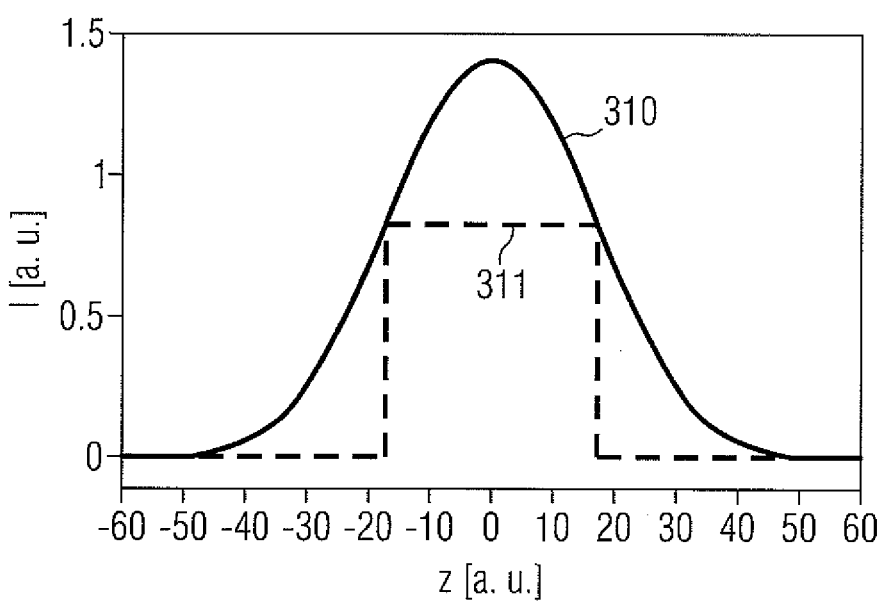
FIG. 3B shows an intensity distribution I of the near field according to a Gaussian distribution.

For comparison, FIG. 3B shows a corresponding profile for a Gaussian intensity distribution 310. In this case, the surface area of the rectangle 311 with maximum surface area amounts to 48.4% of the surface area enclosed by the intensity curve 310. The intensity profile of the near field represented in FIG. 3A thus has a considerably higher homogeneity than a Gaussian intensity distribution.

Figure 4A:
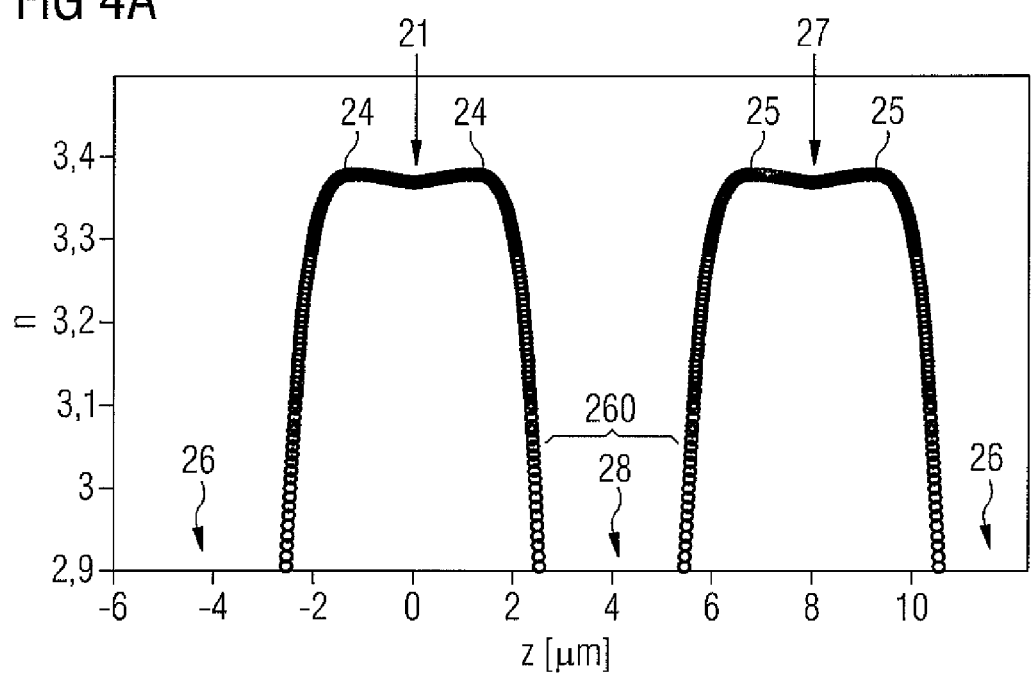
FIG. 4A shows a qualitative distribution of the index of refraction profile for a radiation-emitting component according to a third embodiment shown in a sectional view in FIG. 4B, FIGS. 5A and 5B respectively show a schematic representation of a fourth and a fifth embodiment of an optoelectronic component, in a plan view with the respective associated qualitative index of refraction profile.
Figure 4B:
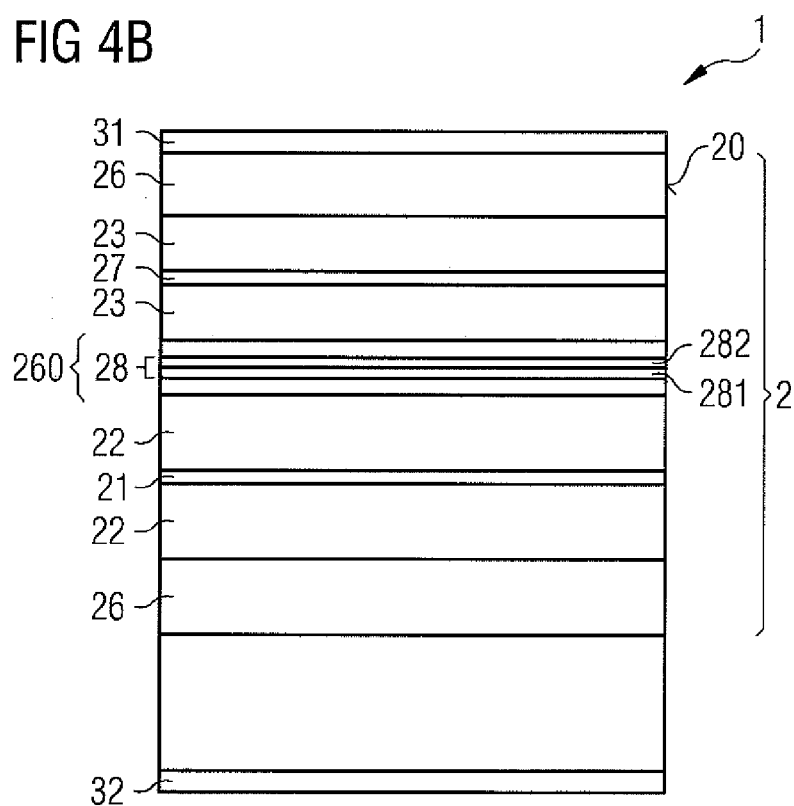

A third embodiment of a radiation-emitting component is shown schematically in a sectional view in FIG. 4B. The associated index of refraction profile 411 is shown in FIG. 4A.

This third embodiment substantially corresponds to the first embodiment described in connection with FIG. 1D. Unlike the latter, besides active region 21, the radiation-emitting component has an additional active region 27. The active region and the additional active region are arranged one above the other. The overall radiation power exiting the component may be increased by the additional active area.

A tunnel region 28 is formed between active region 21 and additional active region 27. Tunnel region 28 is provided to connect additional active region 27 and active region 21 electrically in series. The tunnel region preferably has tunnel layers 281, 282, both layers being particularly highly doped. The dopant concentration in each case is preferably at least $10^{18}$ cm$^{-3}$, particularly preferably at least $10^{19}$ cm$^{-3}$.

Tunnel layers 281, 282 further preferably have different conductivity types, i.e., one tunnel layer is n-doped and the other tunnel layer is p-doped.

Furthermore, an additional cladding layer 260 is formed between active region 21 and additional active region 27. It may be constructed essentially like the cladding layers 26. The distance between active region 21 and additional active region 27 may be adjusted via the thickness of the cladding layer.

Tunnel region 28 is preferably embedded into the additional cladding layer 260. In this case, the tunnel layers of tunnel region 28 may have the same material composition as additional cladding layer 260, apart from the doping. In the area of the cladding layers, the intensity of the near field is comparatively low due to the low indices of refraction. In this manner an absorption of the radiation generated in the active region by the highly doped layers of tunnel region 28 may be greatly reduced.

The additional active region 27 is arranged between additional field-shaping layers 23. Active region 21 and additional active region 27 are constructed identically in this embodiment.

Furthermore, field-shaping layers 22 and additional field-shaping layers 23 are identically constructed. Thus an additional main emission axis runs through the additional active region parallel to the main emission axis. From the additional main emission axis, the index of refraction increases in both directions to an additional maximum value 25 and declines with increasing distance. The index of refraction profile in the area of field-shaping layers 22 or additional field-shaping layers 23 is configured as described in connection with FIG. 1B. Departing from this, the index of refraction profile may have a different profile in one or both of these regions, in particular, a profile as illustrated in FIG. 2B.

Active region 21 and additional active region 27 are decoupled from one another by means of additional cladding layer 260. The active regions 21 and 27 may thus generate coherent radiation largely independently of one another. The degree of coupling of the radiation generated in active region 21 and in additional active region 27 may be adjusted by the thickness of the additional cladding layer. The lower the thickness of the additional cladding layer, the greater the coupling between these active regions. With a lower thickness of the cladding layer, active region 21 and additional active region 27 may thus be coherently coupled. That is to say, the radiation generated in the active region and the radiation generated in the additional active region have a common transversal optical mode.

Departing from the embodiment shown, the active region and the additional active region may be arranged between two neighboring maximum values of the index of refraction profile. In this case, the additional cladding layer between the active region and the additional active region may be omitted.

Figure 5A:
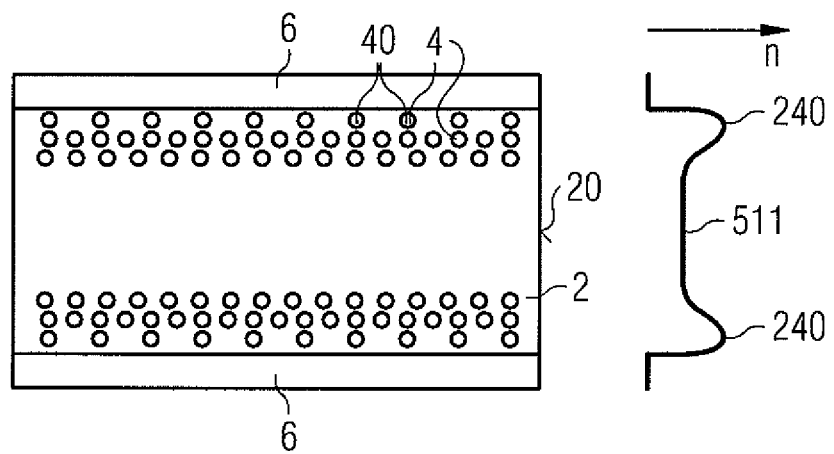
Figure 5B:
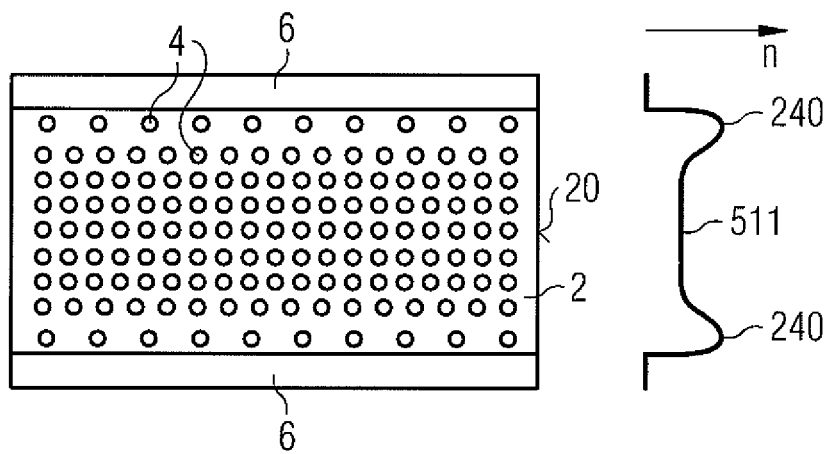

FIGS. 5A and 5B respectively show a fourth and a fifth embodiment of a radiation-emitting component, in a schematic plan view. The associated index of refraction profile is also shown qualitatively for the two embodiments. These index of refraction profiles thus run laterally, unlike the preceding embodiments.

The semiconductor body may additionally have an index of refraction profile in the vertical direction, with which the near field may be homogenized vertically as described above. The vertical structure of semiconductor body 2 with the semiconductor layer sequence may be configured here, for example, as in the embodiments described in connection with FIGS. 1D, 2D or 4B, with the respective associated index of refraction profiles.

Semiconductor body 2 has recesses 4 that extend from a surface perpendicular to side surface 20 into the semiconductor body. The surface of the semiconductor body runs parallel to the active region. The recesses extend from the surface in the direction of active region 21. The recesses preferably do not extend through the active region. The efficient generation of radiation in the active region is facilitated in this manner.

The recesses may be formed in the direction of the active region from one side of the active region, or from both sides of the active region.

The recesses 4 are preferably constructed and arranged in such a manner that, in the lateral direction, i.e., perpendicular to the main emission axis and perpendicular to the deposition direction of the semiconductor layer sequence, an index of refraction profile results, by means of which a specified near field may be adjusted in the lateral direction.

Together with an index of refraction profile in the vertical direction, which may be configured specifically as in the embodiments described in connection with FIGS. 1D, 2D or 4B, the near field may be shaped according to a specified distribution with respect to two mutually perpendicular axes. In particular, a near field may be formed in this manner that has a high homogeneity along both directions. The radiation passing through side surface 20 may thus be distributed particularly homogeneously. This may lead to a reduced maximal optical power density appearing at the side surface. The risk of catastrophic optical damage is thus further reduced.

For the sake of example, identical recesses 4, with which the average effective index of refraction parallel to the main emission axis may be adjusted during the manufacture of the component by means of the density of the recesses, are formed in semiconductor body 2.

According to the embodiment shown in FIG. 5A, the recesses are filled with a filler material 40 that has a larger index of refraction than the material surrounding the recesses. The higher the density of the recesses, the higher the average index of refraction parallel to the main emission axis at a specified distance away from the main emission axis. In this manner, an additional index of refraction profile 511 may be adjusted, in which the index of refraction, starting from the main emission axis, rises to a maximum value 240 and then declines. The initial index of refraction profile may thus be configured, with regard to its qualitative distribution, similarly to the index of refraction profile discussed in connection with FIGS. 1B and 2B.

The recesses may be filled by means of epitaxial overgrowth of the recesses, for example. For instance, recesses in an $Al_xGa_{1-x}As$ semiconductor layer may be filled with an $Al_xGa_{1-x}As$ material that has a lower Al content and therefore a higher index of refraction.

Different geometric shapes may be expedient for the recesses. For example, the recesses may have circular, elliptical and polygonal, especially rectangular basic shapes. Trench-like recesses that may run, in particular, parallel to the main emission axis may also be used.

A boundary layer 6 is arranged laterally on both sides of the semiconductor body. The index of refraction of the boundary layers is expediently lower than the index of refraction of the semiconductor body. The boundary layers 6 preferably contain a dielectric material, in particular, one of the dielectric materials mentioned in connection with filler material 6. Alternatively, the boundary layer may be omitted.

By implementing the additional index of refraction profile, a radiation-emitting component may be constructed in such a manner that the field distribution of the near field along two mutually perpendicular axis corresponds to, or closely approximates, a specified, in particular, an especially homogeneous profile. The risk of catastrophic optical damage, even at high output radiation powers, may thus be extensively reduced.

The fifth embodiment schematically represented in FIG. 5B substantially corresponds to the fourth embodiment described in connection with FIG. 5A. In particular, the recesses 4 are provided, as in the fourth embodiment, for variation of the average index of refraction parallel to the main emission axis. Unlike the fourth embodiment, the recesses are not filled, however, or are at least filled in certain areas, with a filler material that has a lower index of refraction than the adjacent semiconductor material. The average index of refraction may thus be reduced in a targeted manner. In this case, the higher the density of the recesses, the lower the average index of refraction. By means of the recesses near the main emission axis, the average index of refraction may thus be reduced in a targeted manner, so that once again, maximum values 240 like those described in connection with FIG. 5A result for the index of refraction profile.

Specifically, filler material having a lower index of refraction than the material of semiconductor body 2 may be applied by means of vapor deposition or sputtering. For example, a dielectric material is suitable, in particular, an oxide such as silicon oxide or titanium oxide, a nitride such as silicon nitride or an oxynitride such as silicon oxynitride. In this case, the filler material may simultaneously serve as a passivation layer for the semiconductor body.

Alternatively, semiconductor material with a lower index of refraction may be deposited as filler material by means of epitaxial overgrowth.

This patent application claims the priority of German Patent Applications 10 2007 057 773.9 and 10 2007 061 458.8, the disclosures of which are incorporated herein by reference.

The invention is not limited to the description with reference to embodiments. Rather, the invention comprises every novel characteristic as well as every combination of characteristics, which includes in particular, every combination of characteristics in the patent claims, even if this characteristic or this combination itself is not explicitly specified in the claims or the embodiments.

The invention claimed is:

1. A radiation-emitting component with an active region provided for the emission of radiation, having a main emission axis and an index of refraction profile perpendicular to the main emission axis,
    wherein the component has a semiconductor body with a semiconductor layer sequence;
    wherein the semiconductor layer sequence has field-shaping layers arranged on both sides of the active region, the index of refraction profile being formed by means of the field-shaping layers;
    wherein the index of refraction profile runs perpendicular to a main extension direction of the semiconductor layers of the semiconductor body;
    wherein the index of refraction profile is shaped in certain areas according to the square root of a polynomial with even-numbered exponents, the polynomial having the form:

$$A + B *_z{}^\beta - C *_z{}^\gamma$$

where A, B and C are positive coefficients and $\beta$ and $\gamma$ are positive even numbers with $\gamma > \beta$, so that the index of refraction profile increases from the main emission axis at least on one side of the main emission axis with increasing distance from the main emission axis to a maximum value;
    wherein, with increasing distance from the main emission axis, the index of refraction decreases from the maximum value to a value smaller than the index of refraction in the area of the main emission axis; and
    wherein the index of refraction profile decreases, starting from the maximum value, more slowly towards the main emission axis than away from the main emission axis.

2. The radiation-emitting component according to claim 1, wherein the near field has an intensity distribution with which a rectangle with maximum area underneath a curve of the intensity distribution is associated that fills out at least 50% of the total surface area underneath the curve of the intensity distribution.

3. The radiation-emitting component according to claim 1, wherein an additional index of refraction profile is formed in a direction running along a main extension direction of the semiconductor layers of the semiconductor body by means of recesses.

4. The radiation-emitting component according to claim 1, further comprising an additional active region that is provided to generate radiation, and wherein the radiation generated in the active region and the radiation generated in the additional active region have a common transversal optical mode.

5. The radiation-emitting component according to claim 4, wherein the additional active region is arranged relative to the index of refraction profile between the main emission axis and the position of the maximum value of the index of refraction profile.

6. The radiation-emitting component according to claim 1, wherein the radiation-emitting component is constructed as an edge-emitting semiconductor laser component.

\* \* \* \* \*

UNITED STATES PATENT AND TRADEMARK OFFICE
CERTIFICATE OF CORRECTION

PATENT NO. : 9,018,641 B2  
APPLICATION NO. : 12/745686  
DATED : April 28, 2015  
INVENTOR(S) : Peter Brick et al.

Page 1 of 1

It is certified that error appears in the above-identified patent and that said Letters Patent is hereby corrected as shown below:

On the Title Page, Item (73), change "CSRAM Opto Semiconductors GmbH" to --OSRAM Opto Semiconductors GmbH--.

Signed and Sealed this
Twenty-seventh Day of October, 2015

Michelle K. Lee
*Director of the United States Patent and Trademark Office*